United States Patent [19]

Vermeersch et al.

[11] Patent Number: 5,402,725
[45] Date of Patent: Apr. 4, 1995

[54] LITHOGRAPHIC BASE WITH A MODIFIED DEXTRAN OR PULLULAN HYDROPHILIC LAYER

[75] Inventors: Joan T. Vermeersch, Deinze; Paul J. Coppens, Turnhout; Guido I. Hauquier, Nijlen; Etienne H. Schacht, Staden, all of Belgium

[73] Assignee: AGFA-Gevaert, N.V., Mortsel, Belgium

[21] Appl. No.: 889,077

[22] Filed: May 20, 1992

[30] Foreign Application Priority Data

May 23, 1991 [EP] European Pat. Off. ............ 91201227

[51] Int. Cl.⁶ ............................ B41N 1/08; B41N 3/00
[52] U.S. Cl. ........................................ 101/453; 101/456; 101/454; 101/460
[58] Field of Search ............... 101/453, 454, 456, 457, 101/460, 462, 463.1, 465, 466

[56] References Cited

U.S. PATENT DOCUMENTS

| | | | |
|---|---|---|---|
| 3,559,579 | 2/1971 | Perkins | 101/462 |
| 4,046,946 | 9/1977 | Shaw | 101/462 |
| 4,095,525 | 6/1978 | Tsukada et al. | 101/465 |
| 4,097,647 | 6/1978 | Shaw | 101/462 |
| 4,563,410 | 1/1986 | DeJaeger et al. | 101/464 |
| 4,731,119 | 3/1988 | Toyama et al. | 101/451 |
| 4,879,193 | 11/1989 | Takaya et al. | 101/468 |
| 4,996,135 | 2/1991 | Toyama et al. | 101/466 |

Primary Examiner—Edgar S. Burr
Assistant Examiner—Stephen R. Funk
Attorney, Agent, or Firm—Breiner & Breiner

[57] ABSTRACT

This invention provides a lithographic base comprising a support provided with a hardened hydrophilic layer wherein the hardened hydrophilic layer comprises a dextran or pullulan modified with a group containing amine or amide functions having at least one free hydrogen.

5 Claims, No Drawings

# LITHOGRAPHIC BASE WITH A MODIFIED DEXTRAN OR PULLULAN HYDROPHILIC LAYER

DESCRIPTION

1. Field of the Invention

The present invention relates to a lithographic plate base comprising a support coated with a hydrophilic layer and a method for producing a lithographic printing plate therewith.

2. Background of the Invention.

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

Several types of supports can be used for the manufacturing of lithographic printing plates. Common supports are metal supports like Al or Zn. However other supports are known such as e.g. polyester film supports or paper bases coated with a hydrophilic layer to form the hydrophilic background of the printing plate (see for example DE*P-1900469, DE-P-2030634 and US-P-3971660).

It is known to use as hydrophilic layer in these systems a layer containing polyvinyl alcohol and hydrolysed tetraethyl orthosilicate and preferably also silicium dioxide and/or titanium dioxide as described in e.g. GB-P-1419512, FR-P-2300354, U.S. Pat. No. 3971660 and 4284705. These types of lithographic bases can be employed in several methods for preparing a lithographic printing plate e.g. in the production of presensitized plates, lithographic printing plates based on the silver salt diffusion transfer reversal (hereinafter abbreviated as DTR) process, lithographic printing plates produced by the electrophotographic imaging method etc..

A general disadvantage however of said lithographic plate bases is the use of tetraalkylorthosilicates among some highly toxic.

In a common method for the production of presensitized plates a support provided with a hydrophilic layer e.g. a layer as described above is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used. These systems have been extensively reviewed by Kosar J. in "Light-Sensitive Systems", Wiley, New York, 1965, Chapter 7.

A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts the photolysis products of which can harden polymers (natural colloids or synthetic resins) directly and diazonium polymers. Although polymers containing diazonium groups have a large structure they may remain water soluble owing to the presence of the ionic diazonium groups. When these groups are destroyed by exposure to light an insoluble resin is formed. Particularly useful diazonium polymers are the polycondensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

The use of a hydrophilic layer of polyvinyl alcohol hardened with hydrolysed tetraalkylorthosilicate in combination with diazo resins has the disadvantage that the diazo resin remains in the non-image parts of the plate when processed with plain water which may result in scumming during printing. This disadvantage may probably be attributed to the strong adsorbance of the diazo resin to the hydrophilic layer employed.

Because of the disadvantages of the above described lithographic base which can mainly be attributed to the tetraalkylorthosilicate agent used as a hardening agent for the hydrophilic layer attempts have been made for replacing the hydrophilic layer with an alternative. For example an attempt has been made to replace the tetraalkylorthosilicate hardening agent with alternative hardeners such as e.g. aldehydes e.g. formaldehyde or glyoxal. However these alternative hardeners have the disadvantage that they should be employed in large amounts to obtain an acceptable hardening level of the hydrophilic layer which impairs tile keeping properties especially of presensitized plates.

SUMMARY OF THE INVENTION

It is an object of the present invention to provide a lithographic plate base comprising a support coated with a novel type of hydrophilic layer.

It is a second object of the present invention to provide an imaging element comprising a support coated with a novel type of hydrophilic layer and a light-sensitive layer.

It is a third object of the present invention to provide a method for producing a lithographic printing plate comprising the information-wise exposure and development of an imaging element comprising a support coated with a novel type of hydrophilic layer and a light-sensitive layer.

Still other objects of the present invention will become clear from the description hereinafter.

According to the present invention a lithographic plate base is provided comprising a support provided with a hardened hydrophilic layer comprising a dextran or pullulan modified with a group containing amine or amide functions having at least one free hydrogen.

According to the present invention an imaging element is provided comprising a support provided with (i) a hardened hydrophilic layer comprising a dextran or pullulan modified with a group containing amine or amide functions having at least one free hydrogen and (ii) a light-sensitive layer.

According to the present invention there is also provided a method for producing a lithographic printing plate comprising the steps of information-wise exposing an imaging element comprising a support provided with (i) a hardened hydrophilic layer comprising a dextran or pullulan modified with a group containing amine or amide functions having at least one free hydrogen and (ii) a light-sensitive layer and subsequently developing said information-wise exposed imaging element.

DETAILED DESCRIPTION

Preferably used in accordance with the present invention are dextrans or pullulan wherein at least some of the hydroxy groups have been modified into one or more of the following groups:
—O—R¹
—O—CO—R² wherein R¹ represents an organic residue containing an amine or amide function having a free hydrogen atom, e.g. an amine substituted alkyl, an amine substituted alkylaryl etc..

R² has one of the significances given for R¹ or stands for -OR³ or -N(R4)R⁵ wherein R³ has one of the significances given for R¹ and each of R⁴ and R⁵ which may be the same or different represents —provided that the group —O—CO—R² contains at least one amine or amide function having a free hydrogen—hydrogen or an organic group e.g. an alkyl group, a substituted alkyl group, an aryl group, a substituted aryl group, an alkylaryl group, an organic residue containing an amine or amide function having a free hydrogen atom.

Pullulan is a polysacharide that is produced by microorganisms of the Aureobasidium pullulans type (Pullularia pullulans) and that contains maltotriose repeating units connected by a α-1,6 glycosidic bond. Pullulan is generally produced on industrial scale by fermentation of partially hydrolysed starch or by bacterial fermentation of sucrose. Pullulan is commmercially available from e.g. Shodex, Pharmacosmos.

Examples of dextrans or pullulan suitable for use in accordance with the present invention are dextrans or pullulan wherein some of the hydroxyl groups have been modified in one of the groups shown in Table 1.

TABLE 1

| no. | modified group |
|---|---|
| 1 | —O—CH₂—CH₂—NH₂ |
| 2 | —O—CO—NH—CH₂—CH₂—NH₂ |
| 3 | —O—CO—NH—CH₂—CH₂—N(CH₂—CH₂—NH₂)₂ |
| 4 | —O—CO—NH—(CH₂—CH₂—O)ₙ—CH₂—CH₂—NH₂ |
|  | wherein n represents an integer from 1 to 50 |
| 5 | —O—CH₂—CH₂—NH—CH₂—CH₂—NH₂ |

The modified dextrans or pullulan can be prepared by a reaction of a dextran with e.g. alkylating agents, chloroformates, acid halides, carboxylic acids etc...

According to the present invention said hydrophilic layer may be hardened with an aldehyde e.g. formaldehyde, gluteraldehyde, glyoxal or a mixture thereof. Alternatively the oxidation product of e.g. a periodate oxidation of dextran may be used for hardening. The degree of hardening may be adjusted at wish.

Said hydrophilic layer preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas. However when a light-sensitive layer comprising a diazo resin or diazonium salt is applied to the hydrophilic layer it is advantageous not to incorporate silica particles in the hydrophilic layer.

Titanium dioxide and other heavy metal oxides are preferred in the latter case having an average size from 0.3 μm to 0.5 μm.

Said hydrophilic layer for use in accordance with the present invention may be applied to various types of supports. Examples of supports are e.g. photographic film bases e.g. substrated polyethylene terephthalate film, cellulose acetate film, plastics having a metal layer or deposit thereon, a metal support, e.g. aluminium and polyolefin (e.g. polyethylene) coated paper, the polyolefin surface of which may have been roughened and/or subjected to a corona discharge to improve the adherence of the lithographic coating. Said hydrophilic layer is preferably coated to these supports in a thickness of 1 μm to 20 μm.

The lithographic base of the present invention may be coated with one or more light-sensitive layers comprising e.g. a diazo resin, a silver halide emulsion layer, a photopolymerizable or photocrosslinkable composition etc. According to one embodiment of the present invention an imaging element is prepared by applying a layer comprising a photopolymerizable composition and a silver halide emulsion layer to the lithographic base of the present invention. After image-wise exposure of the silver halide emulsion layer and subsequent development a silver image is obtained. The thus obtained silver image is subsequently employed as a mask for the photopolymerizable composition during an overall exposure of the imaging element. Finally the silver image and the non-exposed photopolymerizable composition are removed so that a lithographic printing plate is obtained.

According to the most preferred embodiment of the present invention a light-sensitive layer comprising a diazo resin or a low-molecular weight diazonium salt is applied to the lithographic base of the present invention to obtain a presensitized imaging element. Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium. Examples of low-molecular weight diazonium salt for use in the present invention include: benzidine tetrazoniumchloride, 3,3-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Said light-sensitive layer preferably also contains a binder e.g. polyvinyl alcohol and may be applied to tile lithographic base in a thickness of 0.2 μm to 5 μm. Said presensitized imaging element advantageously contains water-soluble dyes such as rhodamines, sudan blue, methylen blue, eosin or triphenylmethane dyes such as crystal violet, victoria pure blue, malachite green, methylviolet and fuchsia or dye pigments which are essentially water insoluble. Said dyes and/or dye pigments may be present in any layer comprised on the support of said presensitized imaging element but are preferably present in said hydrophilic layer and/or light-sensitive layer.

The exposure of the presensitized imaging element of the preferred embodiment of the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is exposed in such a way that the image obtained thereon is right reading. The exposure may be an exposure using optics or a contact exposure.

The diazo resin or diazonium salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble, the unexposed areas remain unchanged, i. e. water soluble.

When mounted on a printing press the printing plate is first washed with an aqueous fountain solution. To prevent this fountain solution from being contaminated by residual non-exposed diazo which are water soluble, the unexposed diazo resin or diazo urn sa It should be removed from the printing plate before mounting it on a printing press. This removal can be achieved by washing the imaging element with plain water.

According to an alternative embodiment of the present invention a layer of physical development nuclei may be applied to the lithographic base of the present invention. Suitable physical development nuclei for use in accordance with the present invention are e.g. colloidal silver, heavy metal sulphides e.g. silver sulphide, nickel sulphide, palladium sulphide, cobalt sulphide, zinc sulphide, silver nickel sulphide etc. The layer of physical development nuclei may contain a hydrophilic binder but preferably does not contain a binder. The physical development nuclei contained in the image receiving layer can also be present partially or completely in the hydrophilic layer used in accordance with the present invention. A thus prepared element can be used as the image-receiving element in a DTR-process. According to this method an image-wise exposed photographic material comprising a silver halide emulsion layer is contacted with said image-receiving element and developed in the presence of a silver halide solvent e.g. thiosulphate or thiocyanate and one or more developing agents. Both elements are subsequently separated and a silver image is formed in the layer of physical development nuclei comprised on the image-receiving element. More details about this process for obtaining a silver image in said receiving layer can be found in e.g. U.S. Pat. No. 4.649.096 or EP-A-397926. Said silver image is oleophillic while the background of the image-receiving element is oleophobic so that a lithographic printing plate results. It may however be advantageous to improve the oleophilicity of the silver image by treating the silver image with so-called hydrophobizing agents. U.S. Pat. No. 3,776,728 describes the use of heterocyclic mercapto-compounds, e.g. a 2-mercapto-1,3,4-oxadiazole derivative, as hydrophobizing agents. U.S. Pat. No. 4,563,410 discloses hydrophobizing liquids containing one or more mercaptotriazole or mercaptotetrazole derivatives.

According to a further embodiment the lithographic plate base in connection with the present invention may be provided in the order given with an image-receiving layer as described above and a silver halide emulsion layer. An optional intermediate hydrophilic layer containing a hydrophilic non-proteinic film forming polymer and/or polymer beads e.g. of polymethyl methacrylate may be provided between the silver halide emulsion layer and the image-receiving layer. The physical development nuclei contained in the image receiving layer can also be present partially or completely in the hydrophilic layer used in accordance with the present invention. The thus obtained imaging element can be image-wise exposed and developed to obtain a printing plate according to the method disclosed in EP-A-410500 or EP-A-483415.

The lithographic base of the present invention may also be used as a receiving element in a thermal transfer process where a hydrophobic substance or composition is information-wise transferred from a donor element to said lithographic base. Such a process is described in e.g. US-3,060,024, 3,085,488, 3,649,268 and EP-A 91200468.6.

According to a further embodiment of the present invention a toner image may be transferred to tile lithographic base of the present invention during an electrophotographic process as disclosed in e.g. US-3,971,660 and EP 405,016.

The following examples illustrate the invention without however limiting it thereto. All parts are by weight unless otherwise specified.

EXAMPLE 1

Preparation of dextran 1 (modified group 2 of table 1)

43 g of a dextran having a weight average molecular weight of 70000g/mol was dissolved in 2 l of dry mixture of equal volumes of dimethylsulfoxide and pyridine. This solution was cooled to 0° C. and 43 g of p-nitrophenylchloroformate and 1.5 g of dimethylaminopyridine were added. This mixture was kept four hours at 0° C. and was then dropwise added to 1 l of 1,2-diaminoethane. The resulting reaction mixture was then stirred for 48 hours at room temperature. The obtained modified dextran was isolated 5 front the reaction mixture by precipitation in a 3 to 1 by volume mixture of methanol and diethyl ether and subsequent filtrated. The amine content of the modified dextran was about 1.39 mmol/g. Preparation of dextran 2 (modified group 3 of table 1)

43g of a dextran having a weight average molecular weight of 70000g/mol was dissolved in 2 l of dry mixture of equal volumes of dimethylsulfoxide and pyridine. This solution was cooled to 0° C. and 43 g of p-nitrophenylchloroformate and 1.5 g of dimethylaminopyridine were added. This mixture was kept four hours at 0° C. and was then dropwise added to 375 ml of tris(aminoethyl)amine. The resulting reaction mixture was then stirred for 48 hours at room temperature. The obtained modified dextran was isolated from the reaction mixture by precipitation in a 3 to 1 by volume mixture of methanol and diethyl ether and subsequent filtrated. The amine content of the modified dextran was about 1.77 mmol/g.

EXAMPLE 2

Preparation of the coating solution for the hydrophilic layer

To 440 g of a dispersion containing 21.5% $TiO_2$ (average particle size 0.3 to 0.5 um) was subsequently added, while stirring, 250 g of a 5% solution of DEXTRAN 1 in water, 38 g of a 3.5% solution of glyoxal in water, 22 g of a 10% solution of a wetting agent and 250 ml water. The pH was adjusted to 4 with a 12% hydrogenchloride solution. Preparation of the coating solution for the photosensitive layer.

To 80 g of a 20% dispersion of polymethylmethacrylate (particle size of 60 nm) stabilized with cetyltrimethylammonium bromide in water were subsequently added while stirring, 240 g of a 5% solution of a 88% hydrolysed polyvinylacetate in water and 60 g of a 7.5% dispersion of Hostaperm Blue (Hoechst) in water. 80 g of a 15% solution of the condensation product of diphenylamine diazoniumsalt and formaldehyde, in water was slowly added to the above mixture. Finally 10 g of a wetting agent and 510 ml water were added.

Preparation of the imaging element

The coating solution for the hydrophilic layer was coated on a polyester support containing a subbing layer at a wet coating thickness of 50g/m² and dried at 35° C. To the thus obtained element was coated the coating solution for the photosensitive layer at a wet coating thickness of 35 g/m² and dried at 30° C.

Preparation of the Lithographic Printing Plate

The resulting imaging element was exposed through a mask to a high pressure halogen mercury vapour lamp of 1000W at a distance of 70 cm for 2 minutes. Subsequently the imaging element was developed in a Polychrome PC28E PSprocessor containing plain water at 25° C. in its developing section.

The obtained lithographic plate when used on an AB-Dick 9860 printer using a conventional fountain solution and oleophillic lithographic inks, gives rise to images with high density (more than 1.5) and no scumming in tile non-image areas.

EXAMPLE 3

Preparation of the Coating Solution for the Hydrophilic Layer

To 440 g of a dispersion containing 21.5% $TiO_2$ (average particle size 0.3 to 0.5 um) was subsequently added, while stirring, 250 g of a 5% solution of DEXTRAN 2 in water, 38 g of a 3.5% solution of glyoxal in water, 22 g of a 10% solution of a wetting agent and 250 ml water. The pH was adjusted to 4 with a 12% hydrogenchloride solution.

Preparation of the coating solution for the photosensitive layer

To 80 g of a 20% dispersion of polymethylmethacrylate (particle size of 60 nm) stabilized with cetyltrimethylammonium bromide in water were subsequently added while stirring, 240 g of a 5% solution of a partially hydrolysed polyvinylacetate in water and 60 g of a 7.5% dispersion of Hostaperm Blue (Hoechst) in water. 80 g of a 15% solution of the condensation product of diphenylamine diazoniumsalt and formaldehyde, in water was slowly added to the above mixture. Finally 10 g of a wetting agent and 510 ml water were added.

Preparation of the Imaging Element

The coating solution for the hydrophilic layer was coated on a polyester support containing a subbing layer at a wet coating thickness of 55g/m² and dried at 35° C. To the thus obtained element was coated the coating solution for the photosensitive layer at a wet coating thickness of 35 g/m² and dried at 30° C.

Preparation of the Lithographic Printing Plate

The resulting imaging element was exposed through a mask to a high pressure halogen mercury vapour lamp of 1000W at a distance of 70 cm for 2 minutes.

Subsequently the imaging element was developed in a Polychrome PC28 PSprocessor containing plain water at 25° C. in its developing section.

The obtained lithographic plate when used on an AB-Dick 9860 printer using a conventional fountain solution and oleophillic lithographic inks, gives rise to images with high density (more than 1.5) and no scumming in the non-image areas.

EXAMPLE 4

Preparation of the Coating Solution for the Hydrophilic Layer

To 440 g of a dispersion containing 21.5% $TiO_2$ (average particle size 0.3 to 0.5 um) was subsequently added, while stirring, 250 g of a 5% solution of DEXTRAN 1 in water, 20 g of a 4% solution of formaldehyde in water, 22 g of a 10% solution of a wetting agent and 268 ml water. The pH was adjusted to 4 with a 12% hydrogen chloride solution.

Preparation of the Coating Solution for the Photosensitive Layer

To 63 g of a 20% dispersion of polymethylmethacrylate (particle size of 60 nm) stabilized with cetyltrimethylammonium chloride in water were subsequently added while stirring, 120 g of a 5% solution of a 88% hydrolysed polyvinylacetate in water and 15 g of a 10% dispersion in Hostaperm Blue (Hoechst) in water.

66 g of a 15% solution of the condensation product of diphenylamine diazoniumsalt and formaldehyde, in water was slowly added to the above mixture. To this mixture was further added 5 ml of a 10% solution of a wetting agent and 731 ml water.

Preparation of the Imaging Element

The coating solution for the hydrophilic layer was coated on a polyester support containing a subbing layer at a wet coating thickness of 50g/m² and dried at 35 ° C. To the thus obtained element was coated the coating solution for the photosensitive layer at a wet coating thickness of 35 g/m² and dried at 30 ° C.

Preparation of the Lithographic Printing Plate

The resulting imaging element was exposed through a mask to a high pressure halogen mercury vapour lamp of 1000W at a distance of 70 cm for 2 minutes. Subsequently the imaging element was developed in a Polychrome PC28E PS-processor containing plain water at 25 ° C. in its developing section.

The obtained lithographic plate when used on an AB-Dick 9860 printer using a conventional fountain solution an oleophillic lithographic inks, gives rise to images with high density (more than 1.5) and no scumming in the non-image areas.

EXAMPLE 5

Preparation of the Coating Solution for the Hydrophilic Layer

To 571 g of a dispersion containing 21.5% $TiO_2$ (average particle size 0.3 to 0.5 um) was subsequently added, while stirring, 284 g of a 5% solution of a copolymer of 2-hydroxy-3-methacryloxypropyltrimethylammonium chloride and acrylamide in water, 43 g of a 3.5% solution of glyoxal in water, 22 g of a 10% solution of a wetting agent and 79 ml water. The pH was adjusted to 6.

Preparation of the Coating Solution for the Photosensitive Layer

To 80 g of a 20% dispersion of polymethylmethacrylate (particle size of 60 nm) stabilized with cetyltrimethylammonium bromide in water were subsequently added while stirring, 240 g of a 5% solution of a 88% hydrolysed polyvinylacetate in water and 30 g of a 10% dispersion of Hostaperm Blue (Hoechst) in water. 80 g of a 15% solution of the condensation product of diphenylamine diazonium salt and formaldehyde, in water was slowly added to the above mixture. To this mixture was further added 5 ml of a 10% solution of a wetting agent and 565 ml water.

Preparation of the Imaging Element

The coating solution for the hydrophilic layer was coated on a polyester support containing a subbing layer at a wet coating thickness of 50g/m² and dried at 35° C. To the thus obtained element was coated the coating solution for the photosensitive layer at a wet coating thickness of 35 g/m² and dried at 30° C.

Preparation of the Lithographic Printing Plate

The resulting imaging element was exposed through a mask to a high pressure halogen mercury vapour lamp of 1000W at a distance of 70 cm for 2 minutes. Subsequently the imaging element was developed in a Polychrome PC28E PS-processor containing plain water at 25° C. in its developing section.

The obtained lithographic plate when used on an AB-Dick 360 printer using a conventional fountain solution and oleophillic lithographic inks, gives rise to images with density (more than 1.5) and no scumming in the non- image areas.

EXAMPLE 6

An imaging element was prepared as described in example 2 with the exception that the hydrophilic layer was replaced by a hydrophilic layer containing 79.5% of $TiO_2$, 9% of polyvinyl alcohol, 10.5% of aminoethyl carbamate modified pullulan (17% of the repeating units contain the amino group) and 1% of glyoxal.

The obtained imaging element was image-wise exposed and processed as described in example 2 and the thus obtained printing plate was used to print as in example 2.

Copies containing images of high density (more than 1.5) were obtained and no scumming occurred in the non-image areas.

We claim:

1. A lithographic base comprising a support provided with a hydrophilic layer, said hydrophilic layer comprising a compound selected from the group consisting of a dextran and a pullulan, said dextran and pullulan being modified with a group containing an amine function or amide function, said amine or amide functions having at least one free hydrogen, said hydrophilic layer further containing a compound to harden said hydrophilic layer to provide a lithographic base.

2. A lithographic base according to claim 1 wherein said dextran or pullulan is a dextran or pullulan wherein at least some of the hydroxy groups thereof have been modified into one or more of the following groups:

$-O-R^1$ $-O-CO-R^2$ wherein $R^1$ represents an organic residue containing an amine or amide function., said amine and amide function having a free hydrogen atom, $R^2$ has the same significances given for $R^1$ or stands for $-OR^3$ or $-N(R^4)R^5$, wherein $R^3$ has the same significances given for $R^1$ and each of $R^4$ and $R^5$, being the same or different, represents hydrogen or an organic group provided that the group $-O-CO-R^2$ contains at least one amine function having a free hydrogen or one amide function having a free hydrogen.

3. A lithographic base according to claims 1 or 2 wherein hardening is effected by a compound selected from the group consisting of an aldehyde or an oxidation product of a dextran.

4. A lithographic base according to claim 3 wherein said aldehyde is selected from the group consisting of formaldehyde, glyoxal, glutaraldehyde and a mixture thereof.

5. A lithographic base according to claim 1 further comprising an image-receiving layer containing physical development nuclei.

* * * * *

UNITED STATES PATENT AND TRADEMARK OFFICE
CERTIFICATE OF CORRECTION

PATENT NO. : 5,402,725
DATED : April 4, 1995
INVENTOR(S) : Joan T. Vermeersch et al It is certified that error appears in the above-indentified patent and that said Letters Patent is hereby corrected as shown below:

Column 1, line 37 "abbreviated as DIR)" should read -- abbreviated as DTR) --;

Column 3, line 11, "-N(R4)$R^5$" should read -- -N($R^4$)$R^5$ --;

Column 4, line 50, "3,3-dimethylbenzidine" should read -- 3,3'-dimethylbenzidine --;

Column 5, line 28, "diazo urn sa It" should read -- diazonium salt --;

Column 6, line 27, "transferred to tile" should read -- transferred to the --;

Column 6, line 44, "added to 11" should read--added to 1 1--;

Column 6, line 48, "isolated 5 front" should read -- isolated from --;

Column 6, line 52 and 53, "Preparation of dextran 2 (modified group 3 of table 1)" should be a paragraph heading;

Column 6, line 57, "cooled to o° C." should read -- cooled to 0° C. --;

Column 7, line 11 and 12, "Preparation of the coating solution for the photosensitive layer" should be a paragraph heading;

UNITED STATES PATENT AND TRADEMARK OFFICE
CERTIFICATE OF CORRECTION

PATENT NO. : 5,402,725
DATED : April 4, 1995
INVENTOR(S) : Joan T. Vermeersch et al It is certified that error appears in the above-indentified patent and that said Letters Patent is hereby corrected as shown below:

Column 7, line 37, "PSprocessor" should read --PS-processor--;

Column 7, line 43, "in tile non-image areas" should read -- in the non-image areas --;

Column 8, line 15, "PSprocessor" should read --PS-processor--;

Column 10, lines 42 through 45, claim number 3 should read
-- 3. A lithographic base according to claims 1 or 2 wherein said hardening compound is selected from the group consisting of an aldehyde and an oxidation product of a dextran. --.

Signed and Sealed this

Seventeenth Day of October, 1995

Attest:

BRUCE LEHMAN

Attesting Officer         Commissioner of Patents and Trademarks